United States Patent [19]
Yamada et al.

[11] Patent Number: 5,517,017
[45] Date of Patent: May 14, 1996

[54] PHOTOSENSOR FOR DETECTING THE POSITION OF INCIDENT LIGHT IN TWO DIMENSIONS USING A PAIR OF FILM RESISTORS AND A PHOTOCONDUCTIVE ELEMENT SANDWICHED THEREBETWEEN

[75] Inventors: Manabu Yamada, Chiryu; Yutaka Maeda, Takahama; Masaya Nakamura, Nagoya; Tomotsugu Terada, Okazaki; Makoto Shirai, Yokkaichi, all of Japan

[73] Assignee: Nippondenso Co., Ltd., Kariya, Japan

[21] Appl. No.: 211,823

[22] PCT Filed: Aug. 19, 1993

[86] PCT No.: PCT/JP93/01165

§ 371 Date: Jun. 22, 1994

§ 102(e) Date: Jun. 22, 1994

[87] PCT Pub. No.: WO94/05044

PCT Pub. Date: Mar. 3, 1994

[30] Foreign Application Priority Data

Aug. 21, 1992 [JP] Japan .................................. 4-223038

[51] Int. Cl.$^6$ ................................................ G01C 21/02
[52] U.S. Cl. ...................... 250/203.4; 250/206.2; 257/435; 126/573
[58] Field of Search ........................... 250/214.1, 203.4, 250/206.2, 203.1, 203.3, 203.6, 203.2, 208.2, 214 R; 257/431 R, 434, 435; 126/573

[56] References Cited

U.S. PATENT DOCUMENTS

| | | | |
|---|---|---|---|
| 4,018,532 | 4/1977 | Fletcher et al. | 356/141 |
| 4,618,874 | 10/1986 | Yamada | 357/30 |
| 4,727,407 | 2/1988 | Nobue et al. | 357/30 |
| 4,874,937 | 10/1989 | Okamoto | 250/206.2 |
| 4,879,470 | 11/1989 | Sugawa et al. | 250/578 |
| 5,065,015 | 11/1991 | Horiguchi et al. | 250/237 R |
| 5,117,744 | 6/1992 | Zimmer et al. | 454/74 |
| 5,324,929 | 6/1994 | Yamada et al. | |

FOREIGN PATENT DOCUMENTS

| | | |
|---|---|---|
| 56-64611 | 6/1981 | Japan . |
| 56-88364 | 7/1981 | Japan . |
| 57-173256 | 10/1982 | Japan . |
| 62-71713 | 4/1987 | Japan . |
| 62-140407 | 9/1987 | Japan . |
| 63-278284 | 11/1988 | Japan . |
| 64-19107 | 1/1989 | Japan . |
| 4-343276 | 11/1992 | Japan . |
| 5-52921 | 3/1993 | Japan . |

*Primary Examiner*—Edward P. Westin
*Assistant Examiner*—Stephen Calogero
*Attorney, Agent, or Firm*—Cushman, Darby & Cushman

[57] ABSTRACT

A position detection element 4 is formed by sequentially depositing an X-axis resistor film 5, a photoconductive film 6 and a Y-axis resistor film 7 on one surface of a glass substrate 2 which is a transparent member. Further, a light screening film 3 is formed on the other surface of the glass substrate 2. At that time, a pin hole 31 through which light is transmitted is formed at a central portion of the light screening film 3. Where the position detection element 4 and the light screening film 3 are formed integrally with and on the glass substrate 2, mounting of the glass substrate 2 on a casing of a sensor enables the position detection element 4 and the light screening film 3 to be mounted on the casing of the sensor, thus improving the mounting property of the light position detection element 4 and the light screening film 3 on the casing.

4 Claims, 10 Drawing Sheets

FIG. 10

PHOTOSENSOR FOR DETECTING THE POSITION OF INCIDENT LIGHT IN TWO DIMENSIONS USING A PAIR OF FILM RESISTORS AND A PHOTOCONDUCTIVE ELEMENT SANDWICHED THEREBETWEEN

BACKGROUND OF THE INVENTION

1. Field of the Invention

The present invention relates to a photosensor for detecting at least either of the azimuth, altitude and intensity of incident light, and a method of manufacturing the same.

2. Description of Related Art

Solar radiation sensors for detecting the direction of incident light in a compartment of an automobile are disclosed in, for example, Japanese Patent Publication Laid-Open No. sho 62-71713. Such a solar radiation sensor includes a light screening member (an instrument panel 20) having a slit through which solar radiation passes, and photoelectric converting elements (each having a variable resistor element 23, a photoconductive element 24 and a common terminal plate 25) provided below the light screening member at fixed intervals. The solar radiation sensor is adapted to output a signal representing the position of the light illuminated onto the photoelectric converting elements through the slit. A microcomputer detects the direction of an incident light on the basis of the produced signal.

In the above-described conventional solar radiation sensor, the light screening member is constituted by the instrument panel. However, the light screening member is generally formed of a thin plate having a transmission hole, such as a pin hole or a slit. In that case, when the light screening member (hereinafter referred to as a light screening film) constituted by the thin plate and the photoelectric converting elements are mounted on a casing of the solar radiation sensor, the light screening film and the photoelectric converting elements must be mounted separately, deteriorating the mounting property.

This problem occurs not only with solar radiation sensors but also with throttle position sensors which include the light screening film having a transmission hole, such as a pin hole or a slit, and the photoelectric converting elements, as in the above-described solar radiation sensor. In other words, the problem involving deterioration in the mounting property with which the light screening film and the photoelectric converting elements are mounted is common to all the photosensors which include the light screening film having a transmission hole, such as a pin hole or a slit, and the photoelectric converting elements.

In order to overcome the above-described problem, the present invention provides a photosensor which exhibits excellent mounting property with which a light screening film having a transmission hole, such as a pin hole or a slit, and photoelectric converting elements are mounted on a casing of the sensor, as well as a method of manufacturing the photosensor.

SUMMARY OF THE INVENTION

To achieve the above-described object, the present invention provides a photosensor having a transparent member; a photoelectric converting element mounted on the transparent member; and a light screening film mounted on the transparent member and having a transmission hole through which light illuminated on the photoelectric converting element pass.

In the above-described structure, since both the photoelectric converting element and the light screening film are mounted on the transparent member, both the photoelectric converting element and the light screening film can be mounted at the same time on a casing of a photo sensor by mounting the transparent member on the casing of the photo sensor, thus greatly improving the mounting property of the photo sensor.

In order to mount the light screening film and the photoelectric converting element on the transparent member more efficiently, the present invention provides a method of manufacturing a photosensor, which adopts following steps:

a first step of mounting a photoelectric converting element on one of two parallel surfaces of a transparent member and putting a first mark on the one surface of the transparent member at a position separated from a detection surface of the photoelectric converting element concurrently with the mounting of the photoelectric converting element;

a second step of mounting a light screening film, having a transmission hole through which light passes therethrough, on the other surface of the transparent member which is remote from the surface on which the photoelectric converting element is mounted and for putting a second mark on the other surface of the transparent member at a position which has the same positional relationship with a position where the transmission hole is formed as that established between a predetermined position of the detection surface of the photoelectric converting element and the first mark concurrently with the mounting of the light screening film.

The photoelectric converting element or the light screening film is mounted on the one surface or the other surface of the transparent member in either the first step or the second step such that the first mark and the second mark are aligned with each other.

In the above method, the positional relationship between the transmission hole of the light screening film and the photoelectric converting element can be set to a predetermined positional relationship. Accordingly, the positional relationship between the transmission hole of the light screening film and the photoelectric converting element can be freely set according to the positions at which the first and second marks are put. Consequently, in this manufacturing method, the mounting property with which the light screening film and the photoelectric converting element are mounted on a casing of the photosensor can be improved, while the positional relationship between the transmission hole of the light screening film and the photoelectric converting element can be freely set.

BRIEF DESCRIPTION OF THE DRAWINGS

FIG. 10 is an explanatory chart illustrating the principles upon which the light position detection element of the omnidirectional solar radiation sensor of FIG. 2 performs x-coordinate detection, y-coordinate detection and photoelectric current detection;

DETAILED DESCRIPTION OF THE EMBODIMENTS

Embodiments of photosensors according to the present invention will be described below. A first embodiment, which will be described below, shows, as an example of the photosensor, a solar radiation sensor, and a method of manufacturing that solar radiation sensor.

Figure 1:
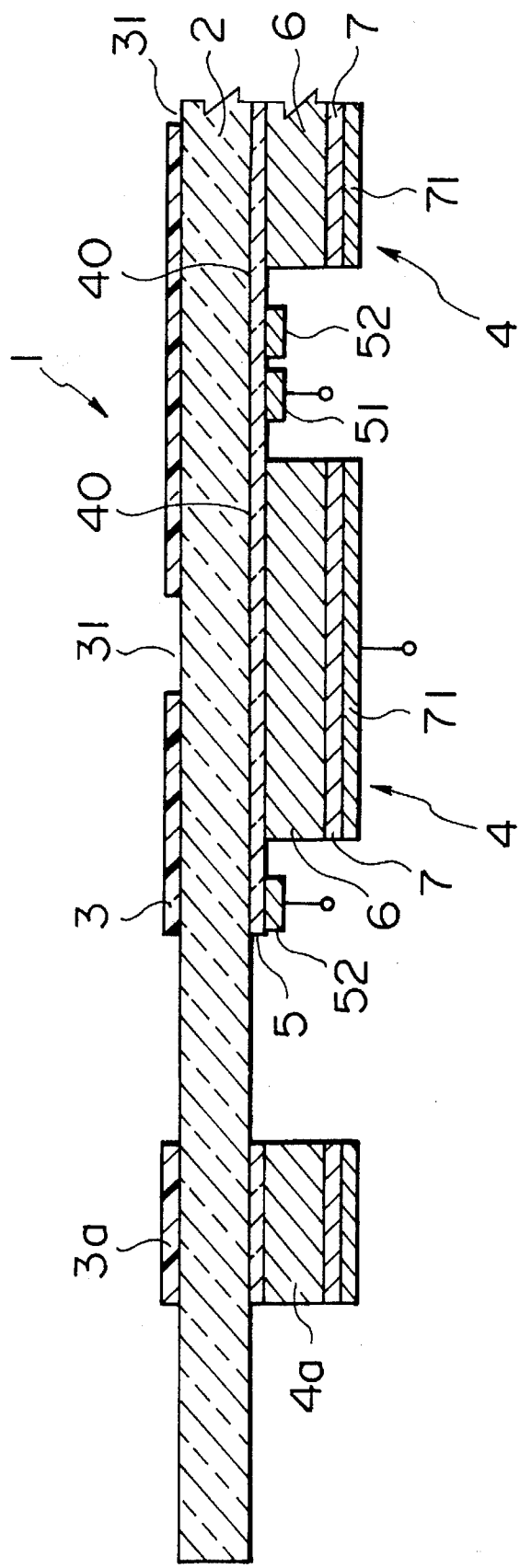
FIG. 1 is a cross-sectional view of a major portion of a first embodiment manufactured by a method in the first embodiment of the present invention.
Figure 2:
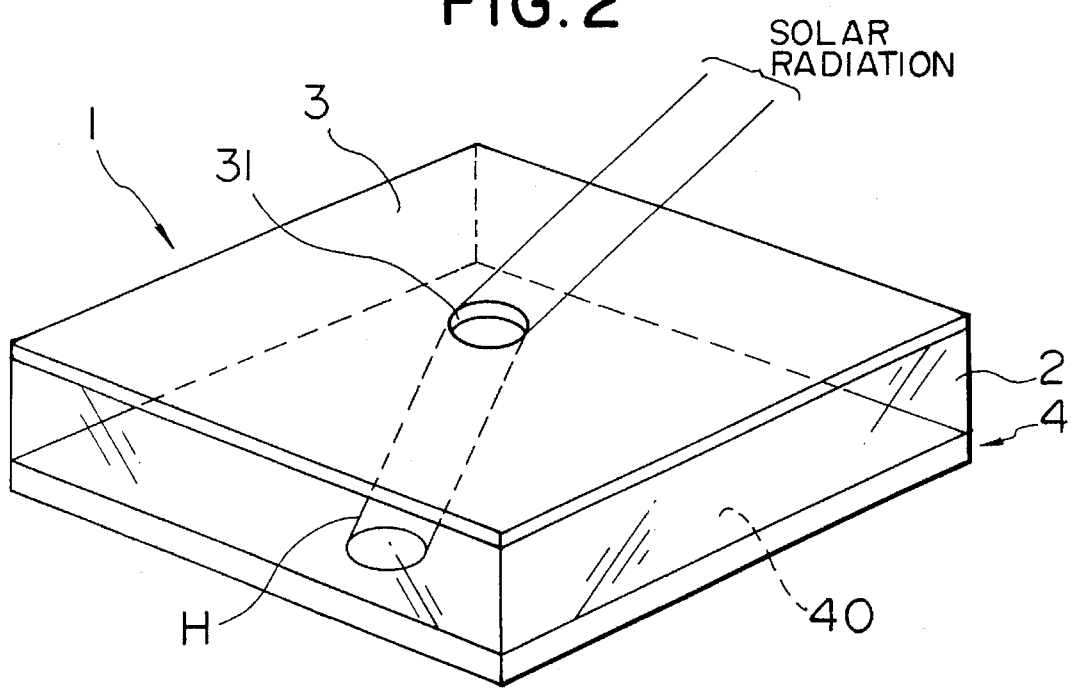
FIG. 2 is a perspective view showing a schematic structure of an omnidirectional solar radiation sensor manufactured by the method in the first embodiment of the present invention.
Figure 3:
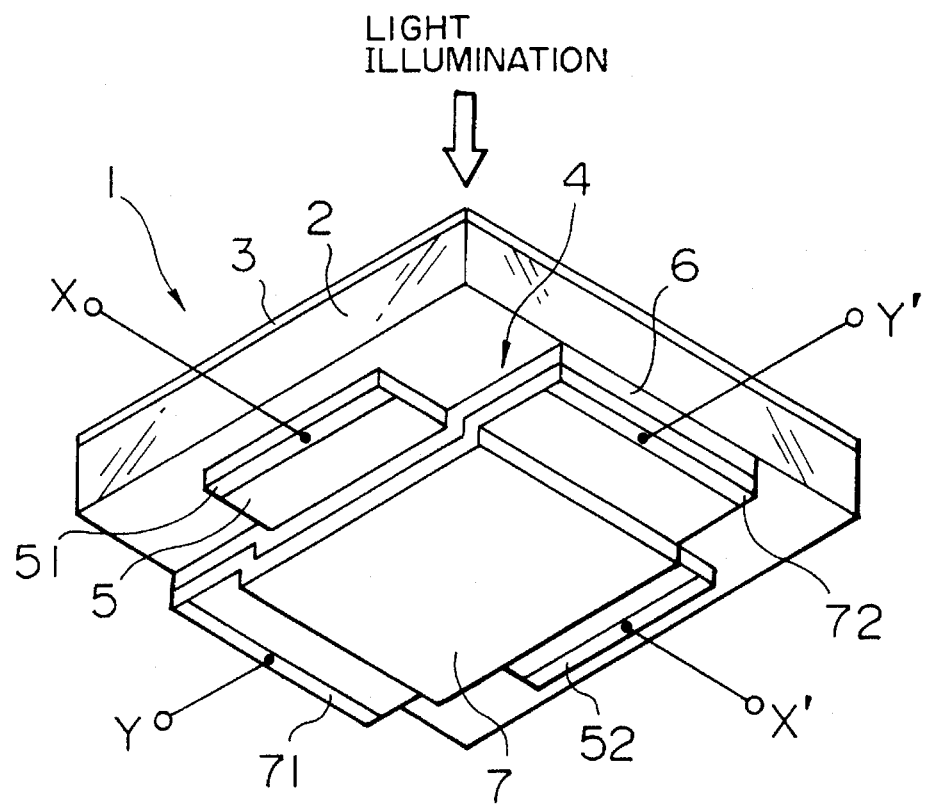
FIG. 3 is a perspective view showing the schematic structure of the omnidirectional solar radiation sensor of FIG. 2.

FIGS. 1 through 3 schematically show an omnidirectional solar radiation sensor manufactured according to the present invention.

An omnidirectional solar radiation sensor 1, which is disposed on, for example, a upper surface of an instrument panel near the windshield of a vehicle, is for use in an automatic air conditioner for a vehicle which is designed to automatically correct an influence of the intensity of direct solar radiation received in the compartment of the vehicle. The automobile air conditioner includes a control circuit (not shown) for automatically controlling an air quantity ratio change over damper (not shown) on the basis of the elevation angle, azimuth angle or intensity of solar radiation detected by the omnidirectional solar radiation sensor 1 in order to linearly switch over the ratio of the air quantity blown from right and left vent outlet (not shown).

The omnidirectional solar radiation sensor 1 includes a glass substrate 2 (as a transparent member) which is a 1.8 mm-thick square soda glass with $SiO_2$ coated on both the front and rear surfaces thereof (in order to prevent diffusion of $Na^+$ in the soda glass), a light screening film 3 formed integrally with the glass substrate 2 on the front surface (one surface) thereof, and a voltage type light position detecting element 4 (as a photoelectric converting element) formed integrally with the glass substrate 2 on the rear surface (the other surface) thereof.

Figure 4:
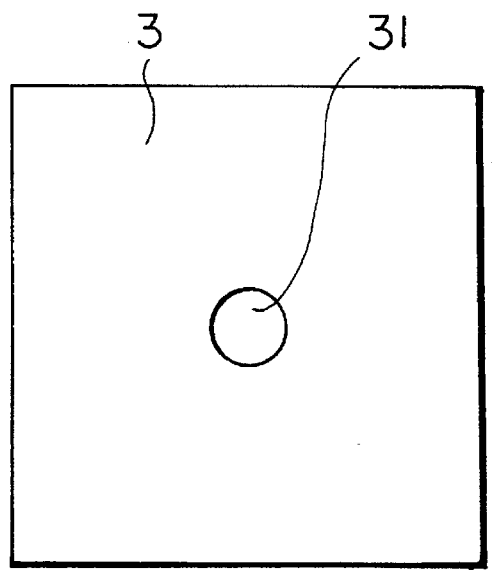
FIG. 4 is a plan view showing the shape of a light screening film of the omnidirectional solar radiation sensor of FIG. 2.

The light screening film 3, as shown in FIG. 4, screens the portion of the surface of a detecting surface 40 of the light position detecting element 4 from light. The detecting surface 40 is located under the glass substrate 2 (see FIG. 1). The light screening film 3 is a square film having dimensions of 12 mm×12 mm and made of a light screening material, such as an epoxy resin with black carbon mixed therein or a black organic substance. The light screening film 3 is formed by screen printing a light screening ink capable of screening light directly on the front surface of the glass substrate 2, and has a pin hole 31 at a central portion thereof so that solar radiation can be illuminated onto the detecting surface 40 of the light position detecting element 4 in a spot. The pin hole 31, which is a transmission hole according to the present invention, is formed in a circular shape at the central portion of the light screening film 3.

Figure 5:
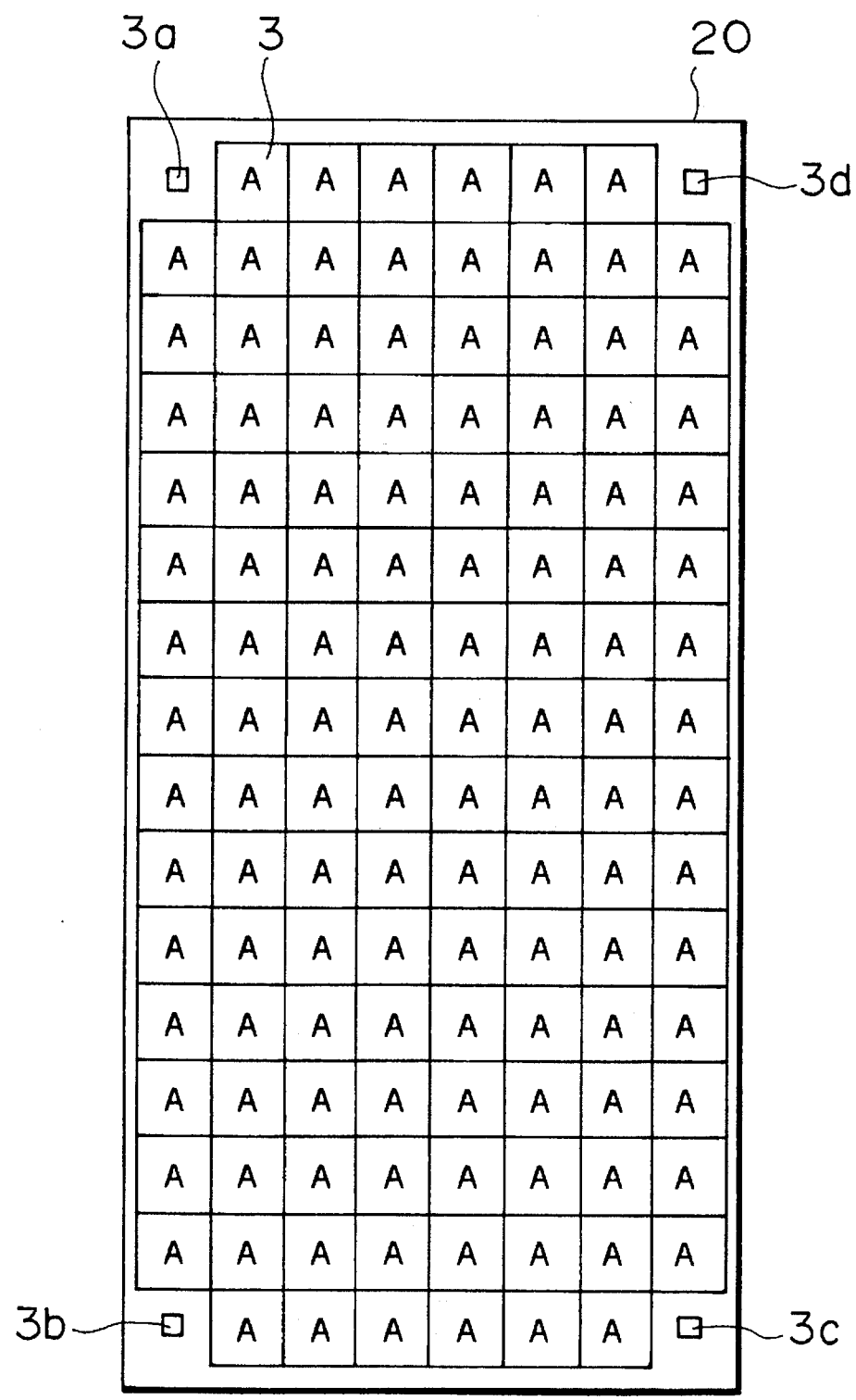
FIG. 5 is a plan view illustrating a state wherein a large number of light screening films are formed on a front surface of a glass substrate.

When the light screening films 3 are formed, four alignment marks 3a through 3d are also screen printed on the front surface of the glass substrate 2 before the light screening films 3 is cut, as shown in FIG. 5. The four alignment marks 3a through 3d are second marks according to the present invention, and each of them is put at a position separated from central points O of the pin holes 31 of the adjacent two light screening films 3 by a predetermined distance (L=12 mm).

The light screening film 3 may also be formed by forming a light screening material which does not transmit light (which may be a metal alloy film or a light transmitting resin) on the front surface of the glass substrate 2 by sputtering or deposition and then by patterning that light screening material using a metal mask by, for example, the photolithographic process.

In FIG. 3, the light position detecting element 4 is formed on the glass substrate 2, and includes an X-axis resistor film 5 made of a transparent resistor, a photoconductive film 6 which utilizes the photoconductive effect of the photoelectric converting film, and a Y-axis resistor film 7 made of a metal electrode resistor. The light position detecting element 4 further includes four lead electrodes X, X', Y, Y' in which the lead electrodes X and X' extend from two end portions of the X-axis resistor film 5, respectively, while the lead electrodes Y and Y' extend from two end portions of the Y-axis resistor film 7, respectively. In the light position detecting element 4, the X-axis resistor film 5 and the Y-axis resistor film 7 are separated from each other with the photoconductive film 6 disposed therebetween. Normally (when the solar radiation sensor is not receiving a light spot H), the X-axis resistor film 5 and the Y-axis resister film 7 are substantially insulated by the photoconductive film 6.

Takeoff connections of the lead electrodes X and X' are formed of X-axis strip electrode pair 51 and 52 having a resistance lower than the X-axis resistor film 5. Similarly, takeoff connections of the lead electrodes Y and Y' are formed of Y-axis strip electrode pair 71 and 72 having a resistance lower than the Y-axis resistor film 7.

The X-axis strip electrode pair 51, 52 are disposed on two opposing sides of the X-axis resistor film 5 in a direction perpendicular to that in which the Y-axis strip electrode pair 71, 72 are disposed on two opposing sides of the Y-axis resistor film 7.

Figure 6:
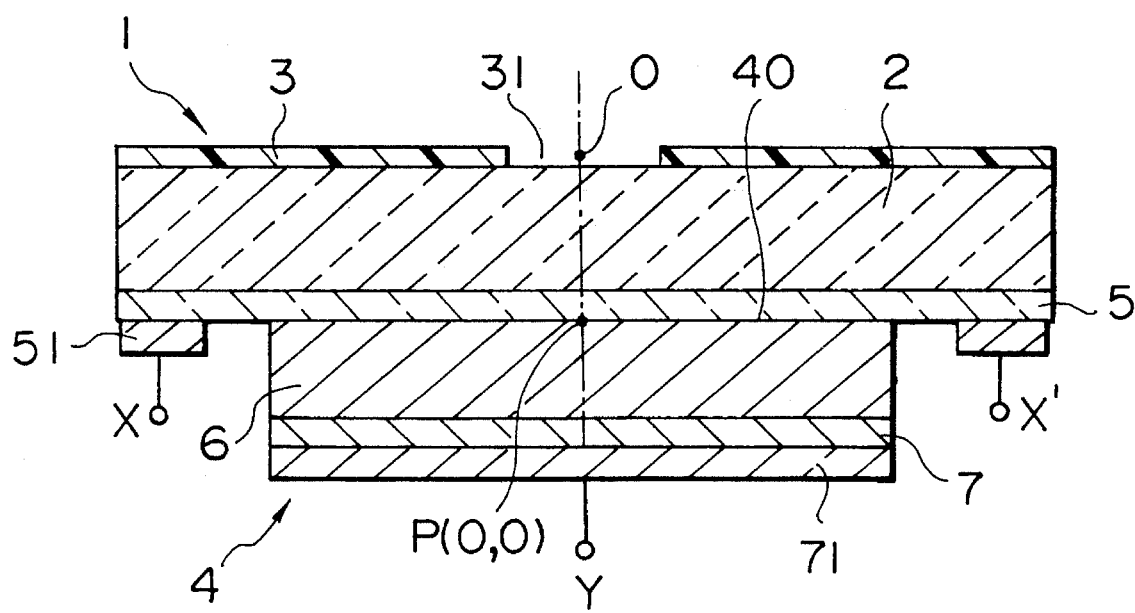
FIG. 6 is a schematic view illustrating a layered structure of a light position detection element of the omnidirectional solar radiation sensor of FIG. 2.
Figure 7:
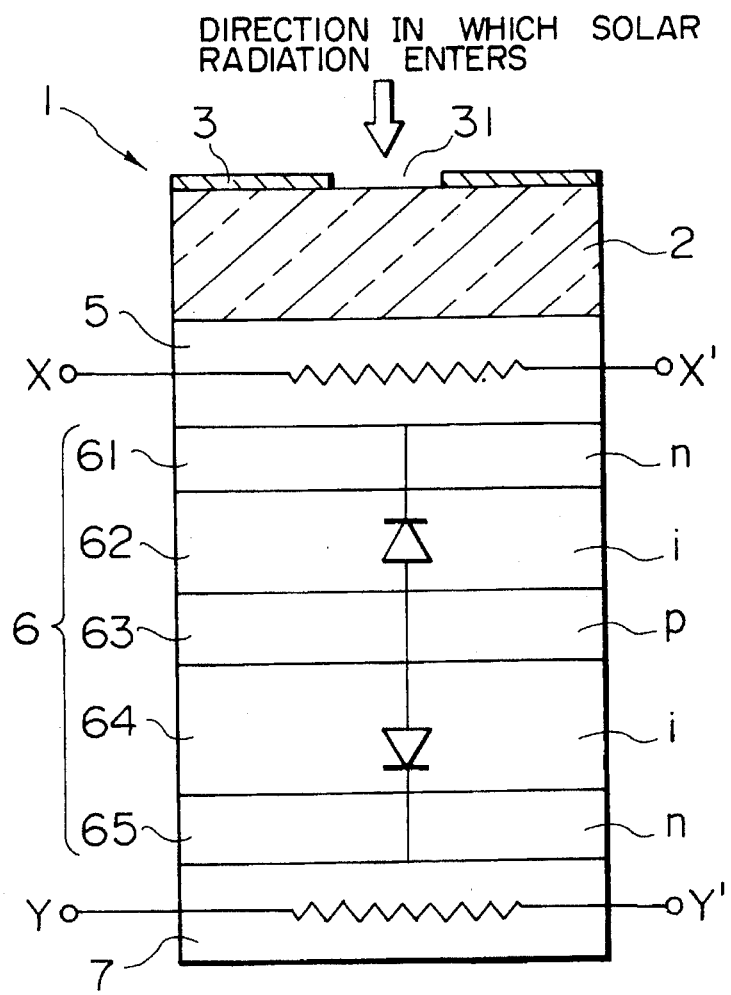
FIG. 7 is a schematic view illustrating a layered structure of a photoconductive film of the omnidirectional solar radiation sensor of FIG. 2.

The material of the individual layers of the light position detecting element 4 and the structure thereof will be described below with reference to the accompanying drawings. FIG. 6 shows the layered structure of the light position detecting element 4. FIG. 7 shows a n-i-p-i-n layered structure of the photoconductive film 6.

The X-axis resistor film 5 is made of a 600 Å-thick $SnO_2$. The sheet resistance of the X-axis resistor film 5 is 200 $\Omega cm^2$. The X-axis resistor film 5 must allow solar radiation to pass therethrough, and must have an adequate sheet resistance to ensure generation of a predetermined voltage gradient between the X-axis strip electrode pair 51 and 52. Thus, in addition to $SnO_2$, other metal oxide films made of, for example, ZnO or ITO may also be used to form the X-axis resistor film 5.

The sheet resistance of the X-axis resistor film 5 is set between 10 $\Omega/cm^2$ and 1 $M\Omega/cm^2$, preferably, between 100 $\Omega/cm^2$ and 50 $k\Omega/cm^2$, because if the X-axis resistor film 5 has too low a sheet resistance, it is impossible to generate a difference in the resistances between the X-axis strip electrode pair 51 and 52, and the X-axis resistor film 5 thus cannot be made a resistor. In contrast, if the X-axis resistor film 5 has too high a sheet resistance and has a sheet resistance higher than the resistance (which is between about 500 $\Omega/cm^2$ and 1 $M\Omega/cm^2$ in case of amorphous silicon) of the photoconductive film 6 illuminated with solar radiation, it produces no output.

The photoconductive film 6 has a structure formed by accumulating an alloy film of, for example, amorphous silicon (hereinafter referred to as a a-Si) in n-i-p-i-n or p-i-n-i-p layers, i.e., in which two diode components are directly connected with each other in such a manner that the polarities thereof are in opposite directions. Thus, even if a voltage of any polarity is applied to the series-connected diode components, a current does not flow in the photoconductive film 6.

The photoconductive film 6 is made up of five layers which include a n-type semiconductor film 61 made of a-Si, an i-type semiconductor film made of a-SiC (amorphous silicon carbide), a p-type semiconductor film 63 made of a-SiC (amorphous silicon carbide), an i-type semiconductor film 64 made of a-Si (amorphous silicon), and an n-type semiconductor film 65 made of a-Si. These layers are formed in that order with the n-type semiconductor film 61 located closest to the solar radiation incident side. The structure of the photoconductive film 6 is equivalent to that formed by connecting two diodes in opposite directions.

The photoconductive film 6 must allow the resistance of only the portion thereof illuminated with a light spot H to greatly reduce. Accordingly, a photoelectric current Iy generated by a photodiode made up of the n-type semiconductor film 61, the i-type semiconductor film 62 and the p-type semiconductor film 63 located on the light incident side must be substantially balanced with a photoelectric current Ix generated by a photodiode formed by the p-type semiconductor film 63, the i-type semiconductor film 64 and the n-type semiconductor film 65.

Hence, in this embodiment, the thickness of the i-type semiconductor film 62 located on the light incident side is made thinner than that of the i-type semiconductor film 64, and a-SiCs having different spectral sensitivities are used to form the i-type semiconductor films 62 and 64. The ratio of the thickness of the i-type semiconductor film 62 to the thickness of the i-type semiconductor film 64 is between 1:2 and 1:10.

The Y-axis resistor film 7 is made of a 400 Å-thick Ti. The sheet resistance of the Y-axis resistor film 7 is 200 $\Omega/cm^2$. The requirements of the Y-axis resistor film 7 are basically the same as those of the X-axis resistor film 5 except that the Y-axis resistor film 7 need not to allow solar radiation to pass therethrough. Thus, in addition to the materials used to form the X-axis resistor film 5, metals, such as Ti, Cr and Ni, TiN, an Au paste, a Ni paste and a Cu paste can also be used as the materials of the Y-axis resistor film 7, if the sheet resistance thereof is between 10 $\Omega/cm^2$ and 1 $M\Omega/cm^2$.

Figure 8:
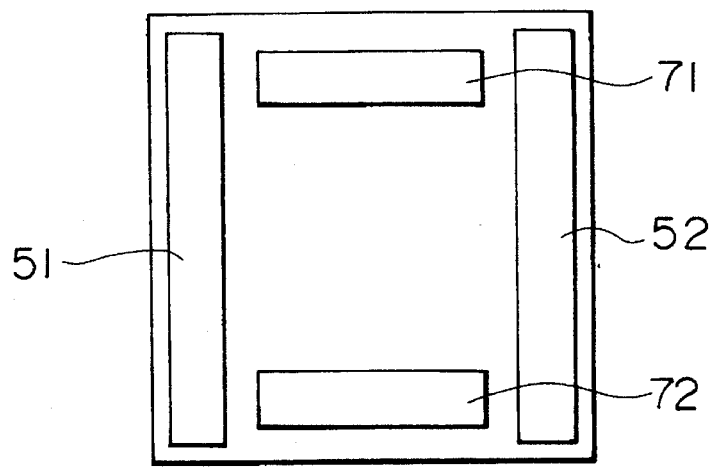
FIG. 8 is a plan view illustrating the shape of an X-axis strip electrode pair and that of a Y-axis strip electrode pair in the omnidirectional solar radiation sensor of FIG. 2.

As shown in FIG. 8, the X-axis strip electrode pair 51, 52 are formed on two opposing sides of the X-axis resistor film 5 by patterning a conductive film made of, for example, Al. In addition to Al, Cr, Ni, Ag and so on are also used as the material of the X-axis strip electrode pair 51, 52.

As shown in FIG. 8, the Y-axis strip electrode pair 71, 72 are formed on two opposing sides of the X-axis resistor film 7 in such a manner that the direction of application of a voltage thereto is orthogonal to that in which a voltage is applied to the X-axis strip electrode pair 51, 52 by patterning a conductive thin film made of, for example Al, as in the case of the X-axis strip electrode pair 51, 52. In addition to Al, Cu, Ni Ag and so on are used as the materials of the Y-axis strip electrode pair 71, 72. However, the use of the same material as that of the X-axis strip electrode pair 51, 52 is desirable.

Figure 9:
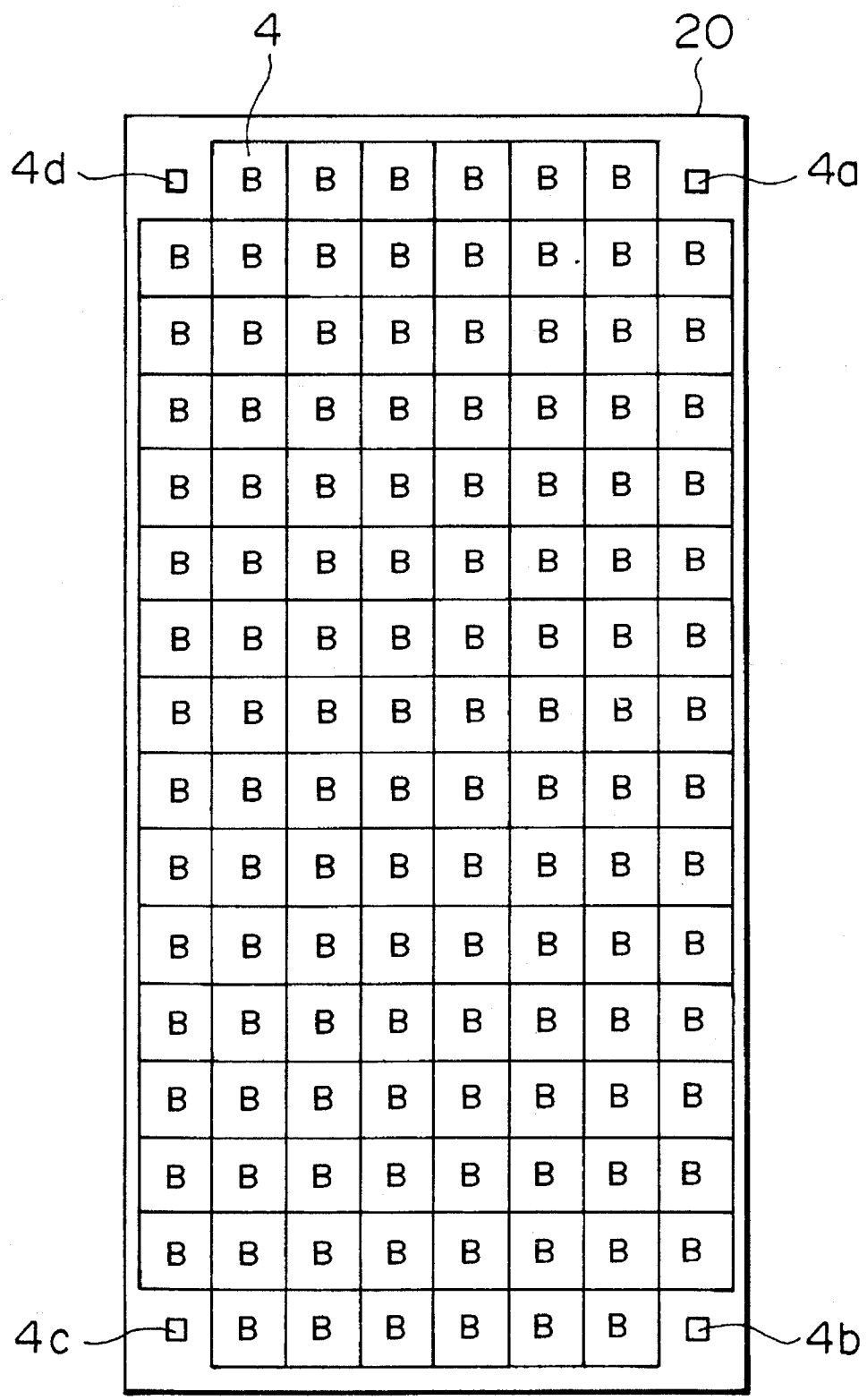
FIG. 9 is a plan view illustrating a state wherein a large number of light position detection elements are formed on a rear surface of the glass substrate.

When the X-axis strip electrode pairs 51, 52 and the Y-axis strip electrode pairs 71, 72 are formed, four alignment marks 4a through 4d are also patterned on the front surface of the glass substrate 2 before the glass substrate 2 is cut as shown in FIG. 9. Each of the four alignment marks 4a through 4d, which are first marks according to the present invention, is put at a position separated from zero points P (0,0) of the detection surfaces 40 of the adjacent two light position detection elements 4 by a predetermined distance (L=12 mm). The four alignment marks 4a through 4d have the same shape (square) as that of the four alignment marks 3a through 3d and the same positional relationship as that of the four alignment marks 3a through 3d so that they can overlap the four alignment marks 3a through 3d.

Figure 10:
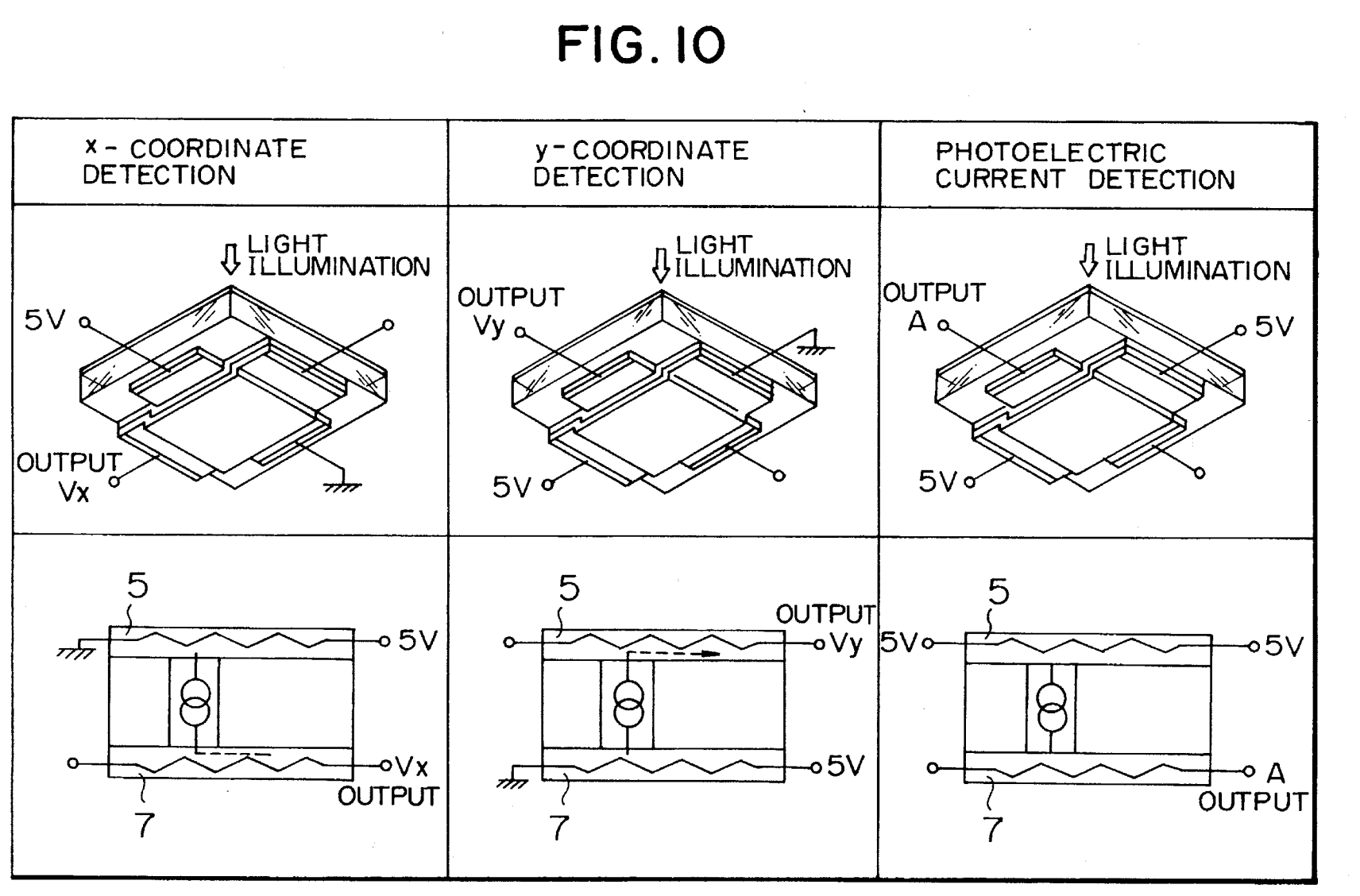

FIG. 10 illustrate the principles upon which the light position detection element performs x-coordinate detection, y-coordinate detection and photoelectric current detection.

Method of Detecting an X-Coordinate

When 0 volt and 5 volts (the voltage being not limited to 5 volts) are respectively applied to the X-axis strip electrode pair 51, 52 acting as X-axis input electrodes, a voltage gradient between 0 volt and 5 volts is generated in the X-axis resistor film 5. When the photoconductive film 6 receives solar radiation in that state, the two diode components located at a position where solar radiation has passed through the photoconductive film 6 conduct, and a voltage inherent in the X-axis resistor film 5 located at a position illuminated with solar radiation is thus taken out from the Y-axis strip electrode 71 acting as the X-axis output electrode.

In this way, the output voltage at the x-coordinate of the position illuminated with solar radiation, i.e., the output voltage (Vx) at the x-coordinate of the point (x, y) of the light spot H incident on the glass substrate 2 on the detection surface 40 of the light position detection element 4, can be detected.

Method of Detecting a Y-Coordinate

When 0 volt and 5 volts (the voltage being not limited to 5 volts) are respectively applied to the Y-axis strip electrode pair 71, 72 acting as Y-axis input electrodes, a voltage gradient between 0 volt and 5 volts is generated in the Y-axis resistor film 7, as in the case of the x-coordinate detection. Accordingly, when solar radiation is illuminated on the photoconductive film 6, a voltage inherent in the Y-axis resistor film 5 located at a position illuminated with solar radiation is thus taken out from the X-axis strip electrode 51 acting as the Y-axis output electrode, as in the above case of the x-coordinate detection.

Consequently, the output voltage at the y-coordinate of the position illuminated with solar radiation, i.e., the output voltage (Vy) at the y-coordinate of the point (x, y) of the light spot H incident on the glass substrate 2 on the detection surface 40 of the light position detection element 4, can be detected.

Method of Detecting Photoelectric Current (an Intensity of Solar Radiation)

The same potential is distributed over the entire X-axis resistor film 5 by applying 5 volts to the X-axis strip electrode pair 51 and 52, and an output current (photoelectric current) which flows on the point P (x, y) on the detection surface 40 of the light position detection element 4 illuminated with the light spot H from the X-axis resistor film 5 toward the Y-axis resistor film 7 is detected.

This output current remains the same no matter which position on the x-axis resistor film 5 is illuminated with the light spot H (because the entire X-axis resistor film 5 has the same potential), and thus becomes an electrical signal which varies according to the intensity of solar radiation.

Since the photoconductive film 6 is constructed such that the two diode components have the same electrical characteristics and their polarities are in opposite directions, the intensity of solar radiation can be detected whichever of the n-type semiconductor film of the X-axis resistor film 5 and that of the Y-axis resistor film 7 is used. Thus, the intensity of solar radiation can also be detected by applying 5 volts to the Y-axis strip electrode pair 71, 72 of the Y-axis resistor film 7.

Figure 11:
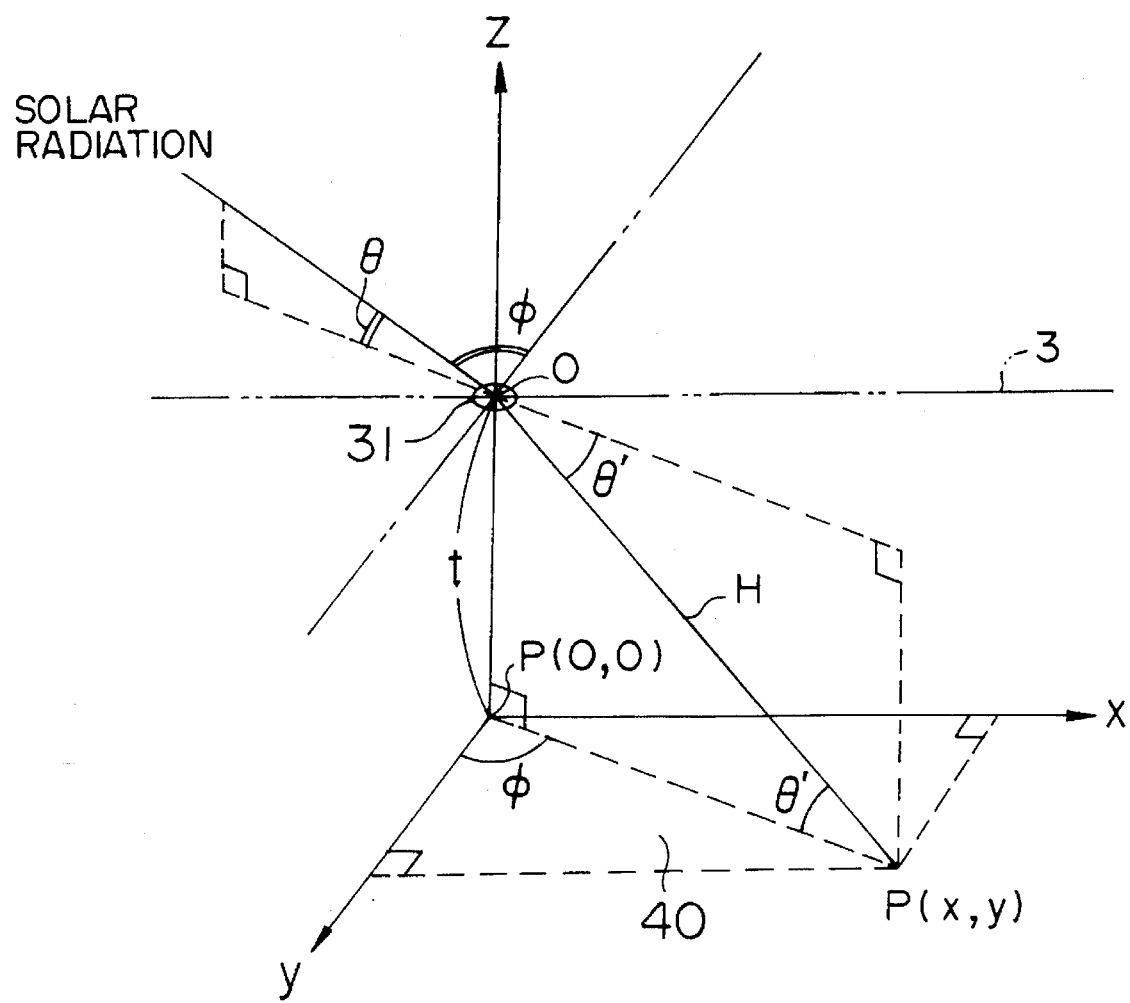
FIG. 11 is an explanatory chart illustrating calculation of the elevation angle and azimuth of solar radiation in the omnidirectional solar radiation sensor of FIG. 2.

Method of Detecting the Elevation Angle and Azimuth Angle of Solar Radiation FIG. 11 illustrates the principle upon which the omnidirectional solar radiation sensor 1 detects the position of solar radiation.

Assuming that the angle at which solar radiation enters the pin hole 31 of the light screening film 3, i.e., the elevation angle of solar radiation, is $\theta$, the angle of the point P (x, y) of the light spot H incident on the glass substrate 2 is $\theta'$, that is, the light spot H reaches the point P (x, y) on the detection surface 40 of the light position detection element 4 at an angle $\theta'$.

The angle between the Y-axis on the detection surface 40 of the light position detection element 4 and the point P (x, y), i.e., the azimuth angle $\phi$ of solar radiation, is calculated using the following equations on the basis of the output voltage (Vx, Vy) detected according to the point P (x, y) of the light spot H:

$$\text{when } x>0 \text{ and } y>0, \phi=\tan^{-1}(x/y)-\pi \quad (1)$$

$$\text{when } x<0 \text{ and } y>0, \phi=\tan^{-1}(x/y)+\pi \quad (2)$$

$$\text{when } y<0, \phi=\tan^{-1}(x/y) \quad (3)$$

Where (Vox, Voy) is the output voltage of the zero point O (0, 0) on the detection surface 40 of the light position detection element 4 located just below the central point O of the pin hole 31 of the light screening film 3 and $\Delta x$ and $\Delta y$ are the voltage gradients (V/m) of the resistor films 5 and 7 of the photoconductive film 6 of the light position detection element 4, respectively, the point P (x, y) of the light spot H is expressed by the following equations:

$$x=(Vx-Vox)/\Delta X \quad (4)$$

$$y=(Vy-Voy)/\Delta y \quad (5)$$

If the refraction factor of air is 1 and if the refraction factor of the glass substrate 2 is n1, the following relation is obtained.

$$\sin\left(\frac{\pi}{2}-\theta\right)/\sin\left(\frac{\pi}{2}-\theta'\right)=n1/1 \quad (6)$$

Since the glass substrate 2 has a thickness t (=1.8 mm), the elevation angle $\theta$ of solar radiation is calculated by the following equation:

$$\theta=\frac{\pi}{2}-\tan^{-1}(A/\sqrt{|1-A^2|}) \quad (7)$$

where $$A = n1 \cdot \sqrt{(x^2+y^2)/(x^2+y^2+t^2)} \quad (8)$$

The photoelectric current A generated at the point P (x, y) of the light spot H is proportional to the intensity of solar radiation I. Since solar radiation actually enters at an angle (elevation angle) $\theta$, the photoelectric current A is expressed as follows:

$$A=I\times\sin\theta \quad (9)$$

Thus, the intensity I of solar radiation is calculated as follows:

$$I=A/\sin\theta \quad (10)$$

A method of manufacturing the omnidirectional solar radiation sensor 1 will now be described briefly with reference to FIGS. 1 through 9.

The X-axis resistor films 5 made of $SnO_2$ are formed over the entire rear surface of the rectangular glass substrate (see FIGS. 5 and 9: 100 mm×200 mm×1.8 mm) with $SiO_2$ coated thereon. Next, the n-type semiconductor film 61 made of a-Si, the i-type semiconductor film 62 made of a-SiC (amorphous silicon carbide), the p-type semiconductor film 63 made of a-SiC, the i-type semiconductor film 64 made of a-Si and the n-type semiconductor film made of a-Si are sequentially accumulated on each of the X-axis resistor films 5.

Next, the Y-axis resistor film 7 made of $SnO_2$ is patterned on the photoconductive film (a-Si alloy) 6 made up of the above-described semiconductor films, and then etching is conducted on the rear surface of the rectangular glass substrate 20 using the Y-axis resistor film as an etching mask to form the photoconductive films 6.

Subsequently, the X-axis strip electrode pair (Al electrodes) 51, 52 and the Y-axis strip electrode pair (Al electrodes) 71, 72, both having the shape shown in FIG. 8, are respectively formed on each of the X-axis resistor films 5 and on each of the Y-axis resistor films 7 in a pattern shown in FIG. 9 in such a manner that they are perpendicular to each other, whereby the large number of light position detecting elements 4 are formed on the rear surface of the glass substrate 20.

At that time, the square alignment marks 4a through 4d made of the same material as that of the light position detecting element 4 are also put, as shown in FIG. 9, at positions having a special relation with the zero points P (0,0) of the detection surfaces 40 of the light position detection elements 4, i.e., at four corners of the rear surface of the glass substrate 20 on which many light position detection elements 4 are formed.

Next, the light screening films 3 each having the pin hole 31, shown in FIG. 4, are formed on the front surface of the glass substrate 20 in a pattern shown in FIG. 5 by screen printing a light screening ink on the front surface of the glass substrate 20.

At that time, as shown in FIG. 5, the square alignment marks 3a through 3d made of the same material as that of the light screening film 3 are also put at positions having a special relationship with the positions where the pin holes 31 of the light screening films 3 are formed, i.e., at four corners of the rear surface of the glass substrate 20 on which many light screening films 3 are formed.

Since the glass substrate 2 and the X-axis resistor films 5 are made of transparent materials, when the glass substrate 20 is viewed from the front surface side thereof, the four alignment marks 4a through 4d formed on the rear surface side of the glass substrate 20 can be seen through the glass substrate 2 and the X-axis resistor films 5.

Accordingly, the large number of light screening films 3 and the alignment marks 3a through 3d can be screen printed on the front surface of the glass substrate 20 in such a manner that the alignment marks 3a through 3d are brought into alignment with the alignment marks 4a through 4d, as partially shown in FIG. 1. Consequently, there is no positional deviation between the zero points P (0,0) of the detection surfaces 40 of the light position detection elements 4 and the central points O of the pin holes 31 of the light screening films 3.

Thereafter, the glass substrate 20 is cut into glass substrates each having a predetermined shape (12 mm×12 mm×1.8 mm) with a glass cutter (not shown) to manufacture the omnidirectional solar radiation sensors 1 shown in FIGS. 2, 3, 6 and 7.

In the manufacturing method according to this embodiment, since the light screening films 3 and the light position detection elements 4 are formed integrally with the glass substrate 20 on the front surface and the rear surface thereof, respectively, the zero points P (0,0) of the detection surfaces 40 of the light position detection elements 4 can be brought into alignment with the central points O of the pin holes 31 of the light screening films 3, as shown in FIG. 6.

Consequently, the central point (0) of the light spot H obtained when the automobile is receiving solar radiation from above, i.e., when the elevation angle θ of solar radiation is 90°, can be brought into coincidence with the output voltage (in this embodiment, zero point P (Vox, Voy)=P (2.5 volts, 2.5 volts) of the zero point P (0,0) of the detection surface 40 of the light position detection element 4 without a light position detecting circuit or a calculation thereof being zero point corrected. As a result, the structure of a control circuit, such as a light position detection circuit or an operation circuit, can be simplified. Further, since the zero points of the detection surfaces 40 of the large number of light position detection elements 4 can be aligned with the central points O of the pin holes 31 in one manufacturing process, the production cost of the omnidirectional solar radiation sensor 1 can be reduced.

A second embodiment of the present invention will be described below. In this embodiment, the present invention is applied to the solar radiation sensor, as in the case of the first embodiment.

Figure 12:
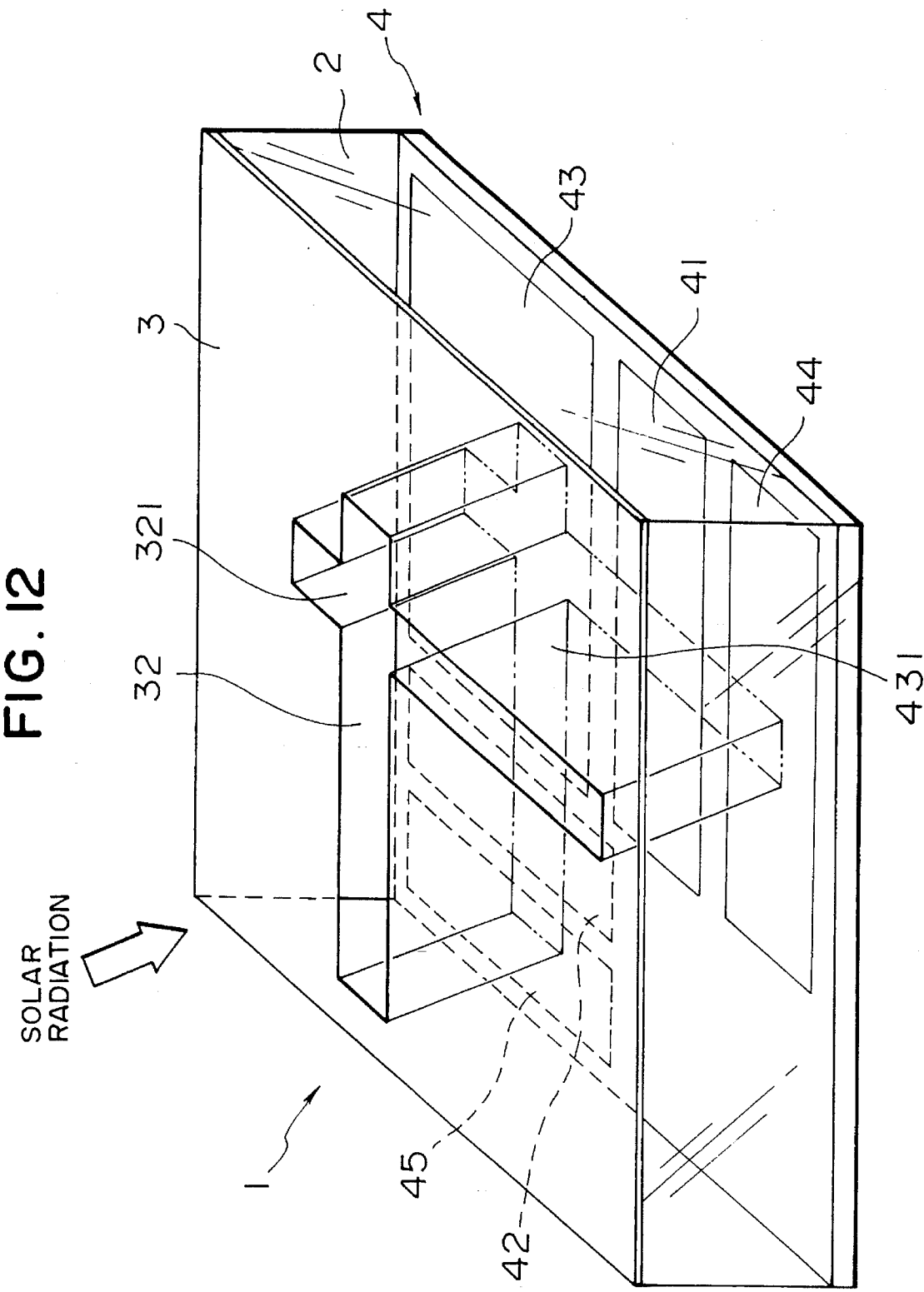
FIG. 12 is a perspective view illustrating the schematic configuration of a second embodiment of the omnidirectional solar radiation sensor manufactured according to the present invention.
Figure 13:
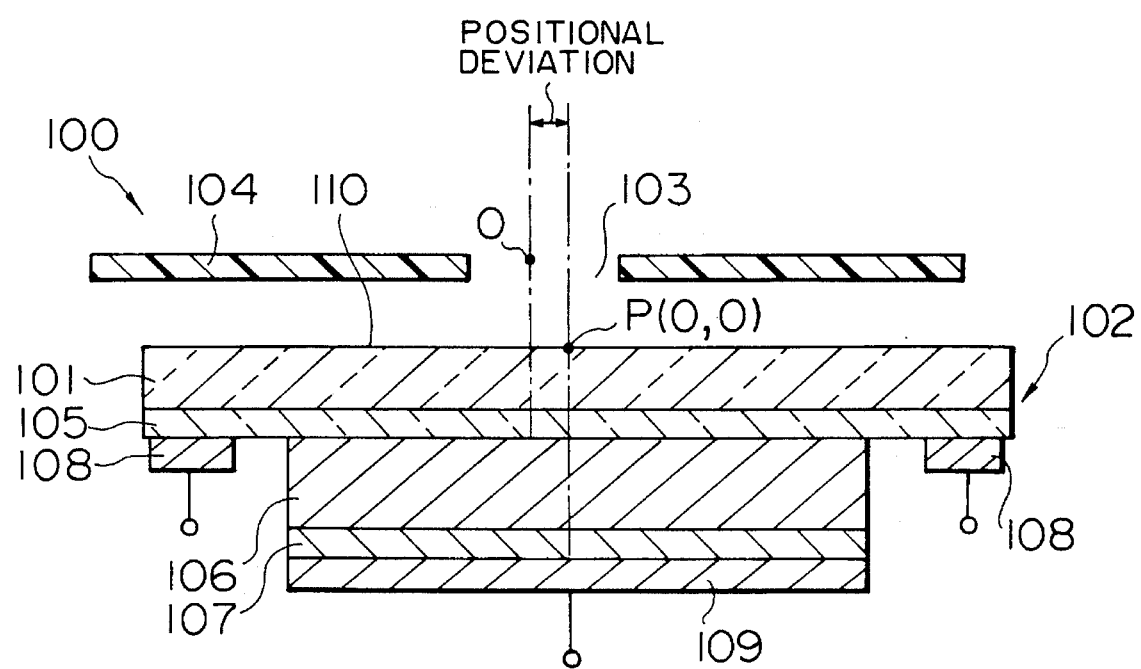
FIG. 13 is a cross-sectional view illustrating the schematic configuration of a light position detection element (not prior art).

FIG. 12 shows the omnidirectional solar radiation sensor according to the second embodiment of the present invention.

In the omnidirectional solar radiation sensor 1, the light position detection element 4 having an X-axis light position detection element 41, a Y-axis light position detection element 42 and photoelectric current detection elements 43 through 45, is patterned on one surface of the glass substrate 2 by, for example, etching, while the light screening film 3 having a cross-shaped light transmission hole 32 is screen printed on the other surface of the glass substrate 2.

In this omnidirectional solar radiation sensor 1, a predetermined position 321 of the cross-shaped light transmission hole 32 and a predetermined position 431 of the photoelectric current detection element 4 are positioned such that they are aligned with each other using alignment marks (not shown).

The X-axis light position detection element 41, the Y-axis light position detection element 42 and the photoelectric current detection elements 43 through 45 are formed in the manner described below: after a transparent conductive film (not illustrated) made of, for example, SnO2, ITO or ZnO, is formed on the glass substrate 2 in predetermined separated shapes, a photoconductive film (not illustrated) made of a n-i-p-i-n amorphous alloy film is formed on the transparent conductive film. Thereafter, a metal electrode (not illustrated) made of, for example, Al, Ni, Ti, Cr or Mo is patterned on the photoconductive film using a metal mask, and then the photoconductive film is etched on the glass substrate 2 using the metal electrode as an etching mask. At that time, the transparent conductive film constituting the X-axis light position detection element 41 and the Y-axis light position detection element 42 acts as a resister film in which a voltage gradient from 0 volt to 5 volts is generated, and the transparent conductive film constituting the photoelectric current detection elements 43 through 45 acts as an electrode for uniformly applying 5 volts to the entire surface of the photoconductive film.

Solar radiation sensors have been described above as examples of the photosensor according to the present invention. However, the present invention can also be applied to, for example, a throttle position sensor or a light position detection apparatus, such as a photoelectric switch. In the first and second embodiments, the solar radiation sensor of the voltage type which detects the position of light by arbitrarily switching over the application of a voltage to the X-axis strip electrode pair and the Y-axis strip electrode pair has been described. However, the present invention can also be applied to a so-called current type solar radiation sensor which detects the position of light on the basis of the ratio of the current output from the X-axis strip electrode pair to the current output from the Y-axis strip electrode pair without arbitrarily switching over the application of a voltage. In addition, the present invention can also be applied to an apparatus for detecting only the direction of light.

In the above-described first and second embodiments, the photoconductive film 6 has a n-i-p-i-n layered structure. However, the photoconductive film may have either a p-i-n-i-p layered structure, a p-i-n layered structure, or a p-n layered structure. When the temperature at which the photosensor is used is 65° C. or below, a photoconductive film made of a single i layer may be used.

In the first and second embodiments, many light screening films 3 and many light position detection elements 4 have been formed on the glass substrate 20 in one manufacturing operation. However, the light screening films 3 and the light position detection elements 4 may be formed on the two surfaces of the glass substrate 20 one at a time.

The alignment marks 3a through 3d can be formed into any shape, as long as that shape is almost the same as that of the alignment marks 4a through 4d. The alignment marks 3a through 3d and 4a through 4d may be made of materials which are the same as or different from those of the light screening film 3 and the light position detection element 4, respectively. Further, there is no limitation to the number of the alignment marks 3a through 3d and 4a through 4d, if it is 2 or more.

In the first and second embodiments, the circular pin hole 31 and the cross-shaped light transmission hole 32 have been respectively used as the light transmission hole. However, a polygonal, elliptical or oval light transmission hole may be employed as the light transmission hole. Further, a plurality of light transmission holes may be provided.

In the first and second embodiments, after the light position detection elements 4 have been formed on the rear surface of the glass substrate 2, the light screening films 3 are formed on the front surface of the glass substrate 2. However, after the light screening films 3 have been formed on the front surface of the glass substrate, the light position detection elements 4 may be formed on the rear surface of the glass substrate 2.

In the first and second embodiments, the glass substrate 2 has been used as the transparent member. However, a transparent material made of, for example, a resin may also be employed.

What is claimed is:

1. A photosensor for detecting the position of incident light in two dimensions and the photoelectric current, comprising:

a transparent member made of glass substrate and having parallel first and second surfaces;

X-axis light position detection element for detecting a X-axis position of light illuminated thereon;

Y-axis light position detection element for detecting a Y-axis position of light illuminated thereon;

a plurality of photoelectric current detection elements for detecting a photoelectric current due to a photoelectromotive force generated on a portion thereof illuminated with said light according to an intensity of said light, said X-axis light position detection element, said Y-axis light position detection element and said plurality of photoelectric current detection elements being disposed on said first surface of said transparent member;

a light screening film mounted on said second surface of said transparent member and having a cross-shaped transmission hole through which light illuminated thereon passes.

2. The photosensor according to claim 1, wherein at least one of said X-axis light position detection element and Y-axis light position detection element is disposed between said plurality of photoelectric current detection elements and parallel thereto.

3. The photosensor according to claim 1, wherein said X-axis light position detection element and Y-axis light position detection element are resister films having a voltage gradient, said plurality of photoelectric current detection elements are transparent conductive films on which a certain voltage is applied uniformly.

4. The photosensor according to claim 1, wherein said cross-shaped transmission hole extends along a X-axis direction and a Y-axis direction of said light screening film, said X-axis light position detection element, said Y-axis light position detection element and said plurality of photoelectric current detection elements have respectively rectangular shape, said X-axis light position detection element and said plurality of photoelectric current detection elements sandwiching said X-axis light position detection element being disposed on said first surface of said transparent member in such a manner that a longitudinal direction of said X-axis direction of said cross-shaped transmission hole forms a right angle to a longitudinal direction of said X-axis light position detection element; said Y-axis light position detection element and said plurality of photoelectric current detection elements sandwiching said Y-axis light position detection element being disposed on said first surface of said transparent member in such a manner that a longitudinal direction of Y-axis direction of said cross-shaped transmission hole forms a right angle to a longitudinal direction of said Y-axis light position detection element.

* * * * *